US008690516B2

(12) United States Patent
Hong et al.

(10) Patent No.: US 8,690,516 B2
(45) Date of Patent: Apr. 8, 2014

(54) METHOD OF ADJUSTING VELOCITY OF TRANSFER MEMBER, METHOD OF TRANSFERRING SUBSTRATE USING THE METHOD, AND SUBSTRATE-PROCESSING APPARATUS

(75) Inventors: Kwang-Jin Hong, Gangwon-Do (KR); Sang-Eun Jun, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 518 days.

(21) Appl. No.: 12/737,841

(22) PCT Filed: Apr. 6, 2009

(86) PCT No.: PCT/KR2009/001755
§ 371 (c)(1),
(2), (4) Date: Feb. 22, 2011

(87) PCT Pub. No.: WO2010/024511
PCT Pub. Date: Mar. 4, 2010

(65) Prior Publication Data
US 2011/0150607 A1    Jun. 23, 2011

(30) Foreign Application Priority Data
Aug. 28, 2008  (KR) .................. 10-2008-0084581

(51) Int. Cl.
*B25J 9/00* (2006.01)
*H01L 21/677* (2006.01)

(52) U.S. Cl.
USPC .......... 414/744.3; 414/805; 414/935; 700/69; 700/228; 901/20

(58) Field of Classification Search
USPC ........... 414/744.3, 744.6, 217.1, 221, 222.01, 414/222.02, 805, 806, 935; 700/69, 219, 700/228, 245; 901/2, 20
See application file for complete search history.

(56) References Cited

U.S. PATENT DOCUMENTS

| 4,972,131 | A | * | 11/1990 | Kojyo et al. | 318/568.1 |
| 5,331,542 | A | * | 7/1994 | Itoh | 700/63 |
| 5,687,085 | A | * | 11/1997 | Morimoto et al. | 700/121 |
| 6,246,923 | B1 | | 6/2001 | Sugimura et al. | |
| 6,725,129 | B2 | * | 4/2004 | Kito | 700/280 |

(Continued)

FOREIGN PATENT DOCUMENTS

JP    8-222618    8/1996
JP    10-335417    12/1998

(Continued)

OTHER PUBLICATIONS

International Search Report (Nov. 23, 2009).

*Primary Examiner* — Dean Kramer
(74) *Attorney, Agent, or Firm* — Harness, Dickey & Pierce, P.L.C.

(57) ABSTRACT

Provided is a method of adjusting a velocity of a transfer arm in a transfer member. The method includes, accelerating the transfer arm from a start point to a first point where a movement velocity reaches a preset reference velocity, dividing a division from the first point to a second point into movement divisions to move the transfer arm in any one of a deceleration motion, an acceleration motion, and a uniform motion according to the respective movement divisions, and decelerating the transfer arm from the second point to a target point. The motion of the transfer arm in the current movement division is different from that in the movement division just before the current movement division. Thus, a different impulse from that in the precedent movement division is applied to a substrate loaded on the transfer arm. Accordingly, the impulse response superposition cancels residual vibration of the substrate, so as to improve transfer efficiency of the transfer member.

13 Claims, 10 Drawing Sheets

(56) References Cited

U.S. PATENT DOCUMENTS

| | | | |
|---|---|---|---|
| 7,699,021 B2 * | 4/2010 | Volfovski et al. | 118/500 |
| 2001/0047225 A1 * | 11/2001 | Shimoike et al. | 700/250 |
| 2006/0241813 A1 * | 10/2006 | Babu et al. | 700/255 |

FOREIGN PATENT DOCUMENTS

| | | |
|---|---|---|
| JP | 2000-223549 | 8/2000 |
| JP | 2000-228435 | 8/2000 |
| JP | 2002-134583 | 5/2002 |
| JP | 2007-012720 | 1/2007 |
| JP | 2007-191252 | 8/2007 |
| JP | 2008-166370 | 7/2008 |
| KR | 100469931 B1 | 4/2005 |
| KR | 100676823 B1 | 2/2007 |
| KR | 100860730 B1 | 9/2008 |

* cited by examiner

METHOD OF ADJUSTING VELOCITY OF TRANSFER MEMBER, METHOD OF TRANSFERRING SUBSTRATE USING THE METHOD, AND SUBSTRATE-PROCESSING APPARATUS

TECHNICAL FIELD

The present invention disclosed herein relates to an apparatus manufacturing a semiconductor substrate, and more particularly, to a method of adjusting the velocity of a transfer member processing a semiconductor substrate, a substrate-transferring method using the adjusting method, and a substrate-processing apparatus.

BACKGROUND ART

In substrate-manufacturing processes, deposition and etching of dielectrics and metal materials, coating and development of photoresists, asher process, etc are repeated a plurality of times to achieve delicate arrangement of patterning. However, although these processes including the etching or the asher process are performed, foreign substances still remain in substrates. Processes for removing these foreign substances include a cleaning process using deionized water or chemical.

Substrate-cleaning apparatuses performing the cleaning process are classified into a batch substrate cleaning apparatus and a single substrate cleaning apparatus. The batch substrate cleaning apparatus includes a chemical bath, a rinse bath, and a dry bath having sizes capable of processing 25 substrates or 50 substrates at once. The batch substrate cleaning apparatus removes foreign substances by immersing substrates in the respective baths for predetermined times. Such a batch substrate cleaning apparatus simultaneously cleans upper and lower portions of a substrate and processes a large amount of substrates simultaneously. However, as the diameters of substrates are increased, the sizes of baths are also increased, so as to increase the size of an apparatus and the amount of chemical. In addition, foreign substances detached from adjacent substrates are attached to substrates being cleaned in a chemical bath.

Recently, as the diameter of substrates is increased, the single substrate cleaning apparatus is widely used. In the single substrate cleaning apparatus, a substrate is fixed to a substrate chuck in a chamber having a small size adapted for processing a single substrate, then rotated by a motor, and then chemical or deionized water is provided to the substrate through a nozzle disposed over the substrate. The spin of the substrate spreads the chemical or the deionized water on the upper portion of the substrate, so as to remove foreign substances from the substrate. The single substrate cleaning apparatus has a smaller size than the batch substrate cleaning apparatus and achieves a uniform cleaning performance.

In general, the single substrate cleaning apparatus includes, from a side thereof, a loading/unloading unit, an index robot, a buffer unit, process chambers, and a main transfer robot. The index robot transfers substrates between the buffer unit and the loading/unloading unit, and the main transfer robot transfers substrates between the buffer unit and the process chambers. At the buffer unit, substrates to be cleaned wait to be inserted into the process chambers, or the substrates that have been cleaned wait to be transferred to the loading/unloading unit.

A transfer robot such as the index robot and the main transfer robot includes a plurality of arms, and a substrate is loaded on each of the arms. The respective arms move horizontally to take out or load substrates from or to storage such as front open unified pods (FOUPs) or the buffer unit.

Because of noise and vibration generated when the transfer robot moves vertically to place substrates on upper surfaces of the arms or when the transfer robot moves vertically with substrates placed on the arms, the transfer robot is required to move at a low speed. Thus, a substrate-transferring time of the transfer robot is increased, and transfer efficiency is decreased.

DISCLOSURE OF INVENTION

Technical Problem

The present invention provides a method of adjusting a movement velocity of a transfer member improving efficiency in transferring a substrate.

The present invention also provides a method of transferring a substrate using the method of adjusting a movement velocity of a transfer member.

The present invention also provides a substrate-processing apparatus processing a substrate using the method of transferring a substrate.

Technical Solution

Embodiments of the present invention provide methods of adjusting a movement velocity of a transfer member having a plurality of transfer arms on which substrates are loaded, the respective transfer arms facing a ground, the methods including: accelerating the transfer arm from a start point where the transfer arm starts to move vertically to a first point where the movement velocity reaches a preset reference velocity; gradually decelerating the transfer arm moving at the reference velocity from a second point to a target point; and dividing a division from the first point to the second point into N movement divisions (where N is a natural number that is at least two) to move the transfer arm in any one of a deceleration motion, an acceleration motion, and a uniform motion according to the respective movement divisions, wherein the motion of the transfer arm in the current movement division is different from that in the movement division just before the current movement division.

In other embodiments of the present invention, substrate-transferring methods using a transfer member having a plurality of transfer arms to which substrates are loaded, the respective transfer arms facing a ground, include: moving the transfer member to a storage member to load or pick up the substrate in the storage member; vertically moving the transfer arm to be disposed at a target point in the storage member; and loading the substrate, placed on an upper surface of the transfer arm, on the target point, or picking up the substrate loaded on the target point.

The moving of the transfer arm includes: accelerating the transfer arm from a start point where the transfer arm starts to move vertically to a first point where a movement velocity reaches a preset reference velocity; dividing a division from the first point to a second point into N movement divisions (where N is a natural number that is at least two) to move the transfer arm in any one of a deceleration motion, an acceleration motion, and a uniform motion according to the respective movement divisions; and decelerating the transfer arm moving at the reference velocity from the second point to the target point, and the motion of the transfer arm in the current movement division is different from that in the movement division just before the current movement division.

In still other embodiments of the present invention, substrate-processing apparatuses include a storage member, a transfer member, and a control unit.

The storage member arranges a plurality of substrates in a vertical direction to store the substrates. The transfer member includes a plurality of transfer arms facing each other in the vertical direction, an arm-driving part moving the respective transfer arms horizontally, and a vertical movement part disposed under the arm-driving part to change a vertical position of the transfer arm, and the substrates are loaded on the respective transfer arms, and the transfer member takes out and loads at least one substrate from and to the storage member. The control unit adjusts a movement velocity of the vertical movement part until the transfer arm moves vertically to reach a target point in the storage member.

The control unit accelerates the vertical movement part to a preset reference velocity until the transfer arm arrives at a first point from a start point, and the control unit gradually decelerates the vertical movement part moving at the reference velocity until the transfer arm arrives at the target point from a second point, and while the transfer arm moves within a division between the first point and the second point, the division being divided into N movement divisions (where N is a natural number that is at least two), the control unit vertically moves the vertical movement part in any one of a deceleration motion, an acceleration motion, and a uniform motion according to the respective movement divisions.

The control unit controls the vertical movement part such that the motion of the vertical movement part in the current movement division is different from that in the movement division just before the current movement division.

Advantageous Effects

According to the present invention, after the transfer member reaches the reference velocity, the transfer member is in the different motion from that in the precedent division according to the respective movement divisions. Thus, a different impulse from that in the precedent movement division is applied to a loaded substrate. Accordingly, the impulse response superposition cancels residual vibration of the substrate, so as to improve transfer efficiency of the transfer member.

BRIEF DESCRIPTION OF DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

MODE FOR THE INVENTION

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
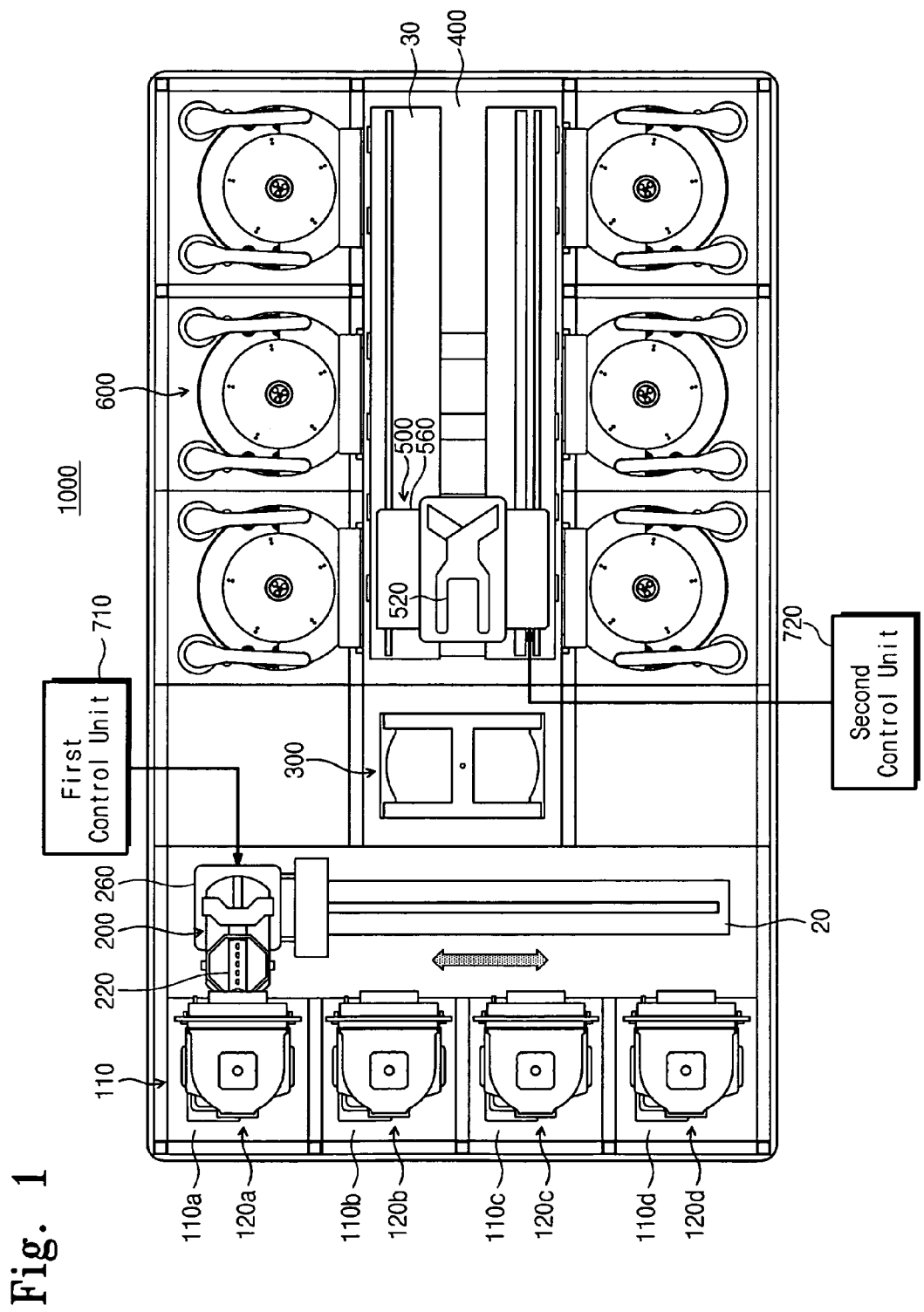
FIG. 1 is a schematic view illustrating a substrate-processing system according to an embodiment of the present invention.
Figure 2:
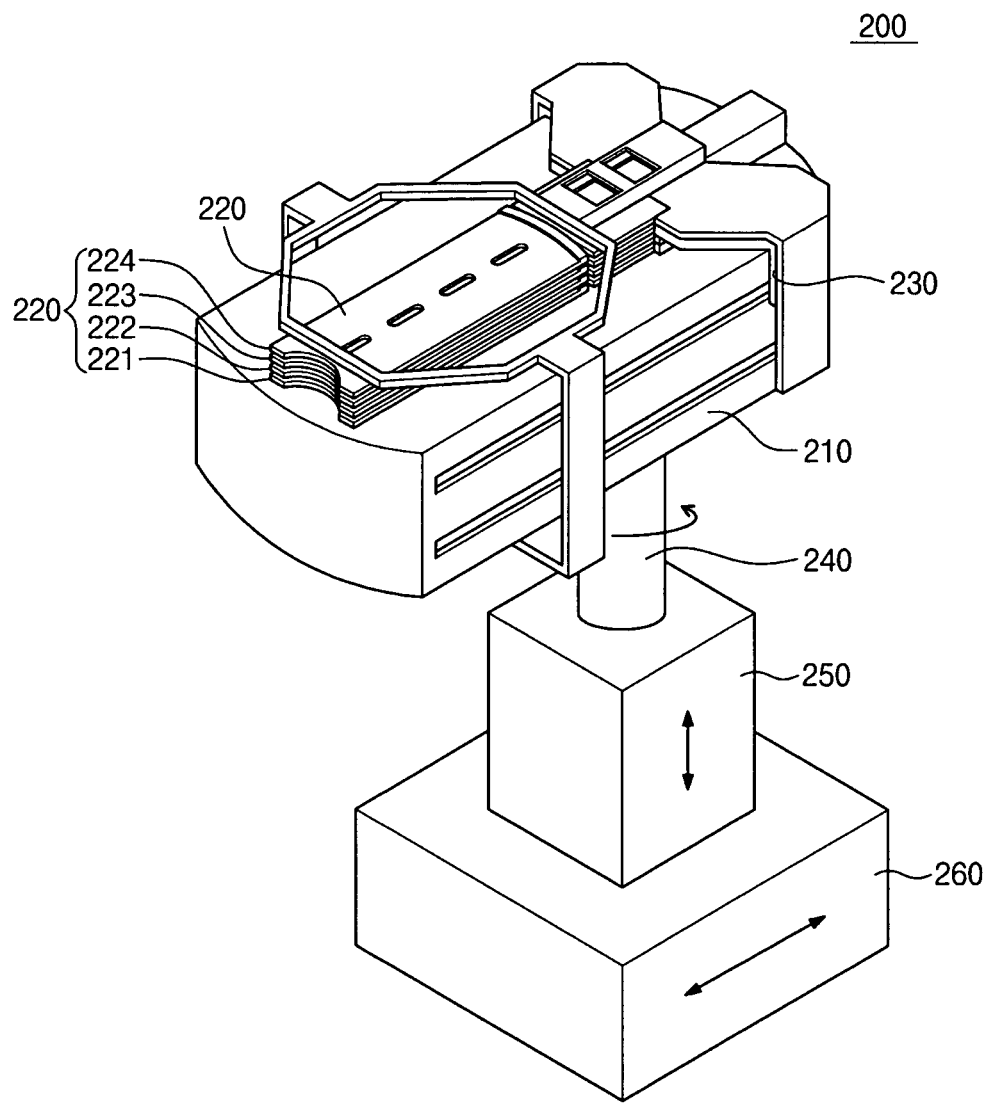
FIG. 2 is a perspective view illustrating an index robot illustrated in FIG. 1.

FIG. 1 is a schematic view illustrating a substrate-processing system 1000 according to an embodiment of the present invention. FIG. 2 is a perspective view illustrating an index robot 200 illustrated in FIG. 1.

Referring to FIGS. 1 and 2, the substrate-processing system 1000 may include a loading/unloading unit 110, the index robot 200, a buffer unit 300, a main transfer robot 500, a plurality of process chambers 600, and first and second control units 710 and 720.

The loading/unloading unit 110 includes a plurality of load ports 110*a*, 110*b*, 110*c*, and 110*d*. Although the loading/unloading unit 110 includes the four load ports 110*a*, 110*b*, 110*c*, and 110*d* in this embodiment, the number of the load ports 110*a*, 110*b*, 110*c*, and 110*d* may be increased or decreased according to process efficiency and footprint conditions of the substrate-processing system 1000.

Front open unified pods (FOUPs) 120*a*, 120*b*, 120*c*, and 120*d* are placed on the load ports 110*a*, 110*b*, 110*c*, and 110*d*. Wafers are stored in the FOUPs 120*a*, 120*b*, 120*c*, and 120*d*. The respective FOUPs 120*a*, 120*b*, 120*c*, and 120*d* are provided with a plurality of slots for storing wafers horizontally to a ground. The FOUPs 120*a*, 120*b*, 120*c*, and 120*d* store wafers that was loaded and have been processed in the process chamber 600 or wafers that will be loaded and processed in the process chamber 600. Hereinafter, for convenience, wafers that have been processed by the substrate-processing system 1000 are referred to as processed wafers, and wafers that are not processed yet are referred to as primitive wafers.

The index robot 200 is disposed between the loading/unloading unit 110 and the buffer unit 300, and a first transfer rail 20 is disposed below the index robot 200. The index robot 200 moves along the first transfer rail 20 and transfers wafers. The index robot 200 may include an arm-driving part 210, an index arm part 220, a plurality of connection parts 230, a rotation part 240, a vertical movement part 250, and a horizontal movement part 260.

Particularly, the arm-driving part 210 moves respective index arms 221, 222, 223, and 224 horizontally. The index arms 221, 222, 223, and 224 are separately driven by the arm-driving part 210.

An upper portion of the arm-driving part 210 is provided with the index arm part 220. The index arms 221, 222, 223, and 224 face each other in the vertical direction, and a wafer is loaded on each of the index arms 221, 222, 223, and 224. In this embodiment, the index robot 200 is provided with the four index arms 221, 222, 223, and 224, but the number of the index arms 221, 222, 223, and 224 may be increased according to the process efficiency of the substrate-processing system 1000.

The index arms 221 and 222 transferring primitive wafers may be referred to as load index arms, and the index arms 223 and 224 transferring processed wafers may be referred to as unload index arms. In this case, the load index arms 221 and 222 and the unload index arms 223 and 224 are disposed separately, not alternately. For example, the unload index arms 223 and 224 may be disposed over the load index arms 221 and 222. Accordingly, the index robot 200 prevents processed wafers from being contaminated by primitive wafers while transferring the primitive wafers and the processed wafers, thereby improving the yield of products.

The load index arms 221 and 222 placed on the loading/unloading unit 110 take out primitive wafers from any one of the waiting FOUPs 120a, 120b, 120c, and 120d and then load the primitive wafers to the buffer unit 300. The index robot 200 takes out at least one primitive wafer at once from the waiting FOUPs 120a, 120b, 120c, and 120d. That is, the load index arms 221 and 222 may simultaneously insert primitive wafers to the process-waiting FOUPs 120a, 120b, 120c, and 120d and then simultaneously take out the primitive wafers. Thus, two primitive wafers may be simultaneously taken out from the process-waiting FOUPs 120a, 120b, 120c, and 120d.

Also, the index robot 200 loads at least one primitive wafer to the buffer unit 300. That is, the load index arms 221 and 222 may be simultaneously inserted to the buffer unit 300 and then simultaneously load primitive wafers thereon to the buffer unit 300. Thus, two primitive wafers may be simultaneously loaded on the buffer unit 300.

For example, the maximum number of wafers taken out by the index robot 200 at once from the process-waiting FOUPs 120a, 120b, 120c, and 120d and the maximum number of wafers loaded at once to the buffer unit 300 are equal to the number of the load index arms 221 and 222.

The unload index arms 223 and 224 unload processed wafers from the buffer unit 300 and load the processed wafers to the index robot 200. The index robot 200 unloads at least one processed wafer at once from the buffer unit 300. That is, the unload index arms 223 and 224 may be simultaneously inserted to the buffer unit 300 and then simultaneously unload primitive wafers from the buffer unit 300. Thus, two primitive wafers may be simultaneously taken out from the buffer unit 300.

Also, the index robot 200 loads at least one processed wafer at once to the process-waiting FOUPs 120a, 120b, 120c, and 120d again. That is, the unload index arms 223 and 224 are simultaneously inserted into the process-waiting FOUPs 120a, 120b, 120c, and 120d, and then simultaneously load processed wafers placed thereon to the process-waiting FOUPs 120a, 120b, 120c, and 120d. Thus, two processed wafers are simultaneously loaded to the process-waiting FOUPs 120a, 120b, 120c, and 120d.

For example, the maximum number of wafers taken out by the index robot 200 at once from the buffer unit 300 and the maximum number of wafers loaded at once to the FOUPs 120a, 120b, 120c, and 120d are equal to the number of the unload index arms 223 and 224.

As such, the index robot 200 takes out and loads a plurality of wafers at once from and to the FOUPs 120a, 120b, 120c, and 120d and the buffer unit 300, thereby reducing time for transferring wafers and improving productivity.

The index arm part 220 is connected to the connection parts 230. The connection parts 230 are coupled to the arm-driving part 210 to move horizontally the connected index arms 221, 222, 223, and 224 according to driving of the arm-driving part 210.

The rotation part 240 is disposed below the arm-driving part 210. The rotation part 240 is coupled to the arm-driving part 210 and rotates to rotate the arm-driving part 210. Accordingly, the index arm part 220 is also rotated.

The vertical movement part 250 is disposed under the rotation part 240, and the horizontal movement part 260 is disposed under the vertical movement part 250. The vertical movement part 250 is coupled to the rotation part 240 to move the rotation part 240 upward and downward, and thus, vertical positions of the arm-driving part 210 and the index arm part 220 are adjusted. The horizontal movement part 260 is coupled to the first transfer rail 20 and moves horizontally along the first transfer rail 20. Accordingly, the index robot 200 moves along an arrangement direction of the load ports 110a, 110b, 110c, and 110d.

The buffer unit 300 is disposed between a region where the index robot 200 is disposed, and a region where the process chambers 600 and the main transfer robot 500 are disposed. The buffer unit 300 receives primitive wafers transferred by the index robot 200, and wafers processed at the process chambers 600.

Figure 3:
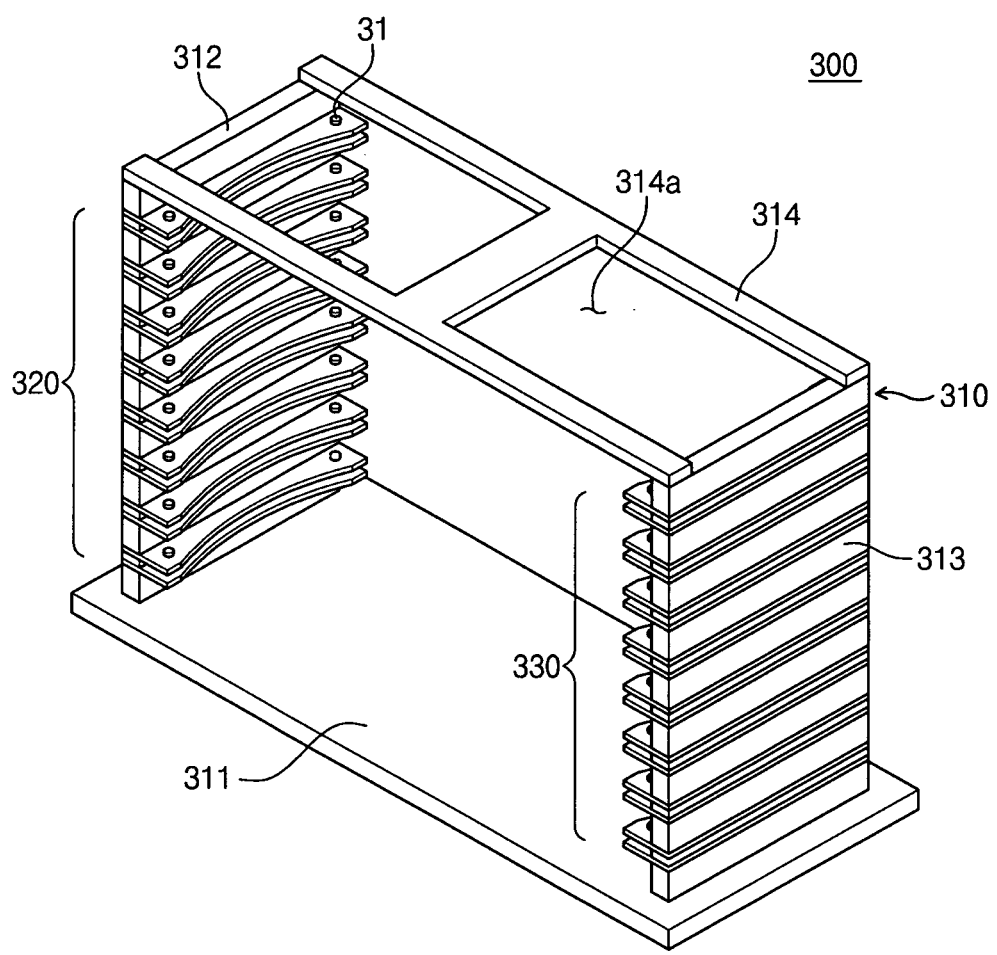
FIG. 3 is a perspective view of a buffer unit illustrated in FIG. 1.

FIG. 3 is a perspective view of the buffer unit 300 illustrated in FIG. 1.

Referring to FIGS. 1 and 3, the buffer unit 300 includes a main body 310 and first and second support parts 320 and 330.

Particularly, the main body 310 may include a bottom surface 311, first and second sidewalls 312 and 313 extending vertically from the bottom surface 311, and an upper surface 314 coupled to upper ends of the first and second sidewalls 312 and 313.

For accessing with wafers, the main body 310 has an open front wall facing the index robot 200 and an open rear wall facing the main transfer robot 500. Accordingly, it is convenient for the index robot 200 and the main transfer robot 500 to insert and take out wafers into and from the buffer unit 300.

The first and second sidewalls 312 and 313 face each other, and the upper surface 314 is partially removed to have an opening 314a.

The first and second support parts 320 and 330 are disposed in the main body 310. The first support part 320 is coupled to the first sidewall 312, and the second support part 330 is coupled to the second sidewall 313. Each of the first and second support parts 320 and 330 includes a plurality of supports. The supports of the first support part 320 are in one-to-one correspondence to the supports of the second support part 330. Wafers are received by the buffer unit 300 with ends of the wafers supported by the supports of the first support part 320 and the supports of the second support part 330, in which the wafers face the bottom surface 311.

The supports of the first and second support parts 320 and 330 are spaced a first gap from each other in the vertical direction with the number of the load index arms 221 and 222 (refer to FIG. 2) and the number of the unload index arms 223 and 224 (refer to FIG. 2). The load index arms 221 and 222 and the unload index arms 223 and 224 are also spaced the first gap, respectively. Accordingly, the index robot 200 takes out and loads a plurality of wafers at once from and into the buffer unit 300. Here, the first gap is equal to a slot gap of the FOUPs 120a, 120b, 120c, and 120d.

The respective supports of the first and second support parts 320 and 330 may be provided with guide parts 31 guiding the positions of wafers. The guide parts 31 protrude from top surfaces of the supports and support side surfaces of wafers.

As described above, the gaps between the supports of the buffer unit 300, disposed sequentially are the same as those between the index arms 221, 222, 223, and 224 that simultaneously pick up or load wafers. Accordingly, the index robot 200 takes out and loads a plurality of wafers at once from and to the buffer unit 300, thereby improving workability and productivity and reducing process time.

The main transfer robot 500 transfers primitive wafers disposed in the buffer unit 300 to the respective process chambers 600. The main transfer robot 500 is disposed at a transfer passage 400, and moves along a second transfer rail 30 disposed at the transfer passage 400. The transfer passage 400 is connected to the process chambers 600.

The main transfer robot 500 picks up primitive wafers from the buffer unit 300, and then moves along the second transfer rail 30 and provides the primitive wafers to the relevant one of the process chambers 600. Also, the main transfer robot 500 loads wafers processed in the process chambers 600 on the buffer unit 300.

Figure 4:
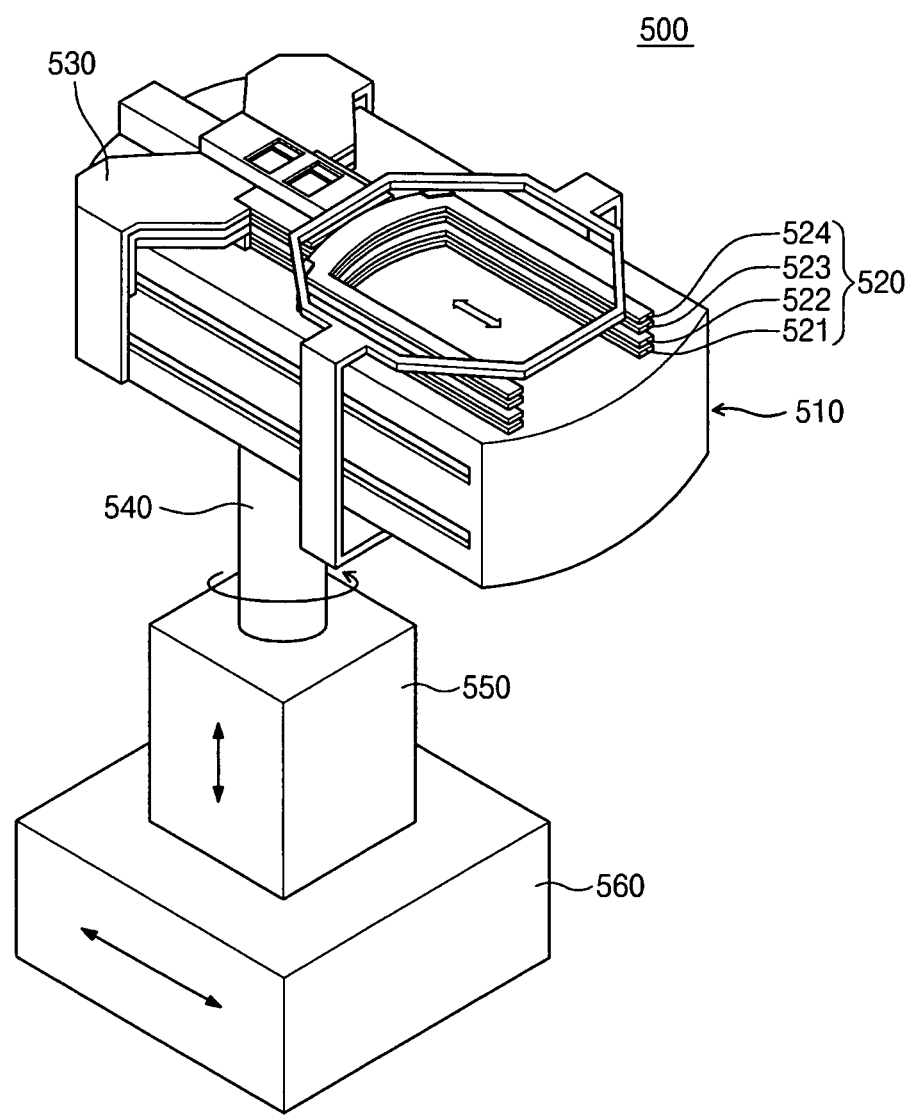
FIG. 4 is a perspective view of a main transfer robot illustrated in FIG. 1.

FIG. 4 is a perspective view of the main transfer robot 500 illustrated in FIG. 1.

Referring to FIGS. 1 and 4, the main transfer robot 500 may include a hand-driving part 510, a pick-up hand part 520, a plurality of connection parts 530, a rotation part 540, a vertical movement part 550, and a horizontal movement part 560.

Particularly, the hand-driving part 510 moves respective pick up hands 521, 522, 523, and 524 horizontally. The respective pick up hands 521, 522, 523, and 524 are independently driven by the hand-driving part 510.

An upper portion of the hand-driving part 510 is provided with the pick-up hand part 520. The pick-up hands 521, 522, 523, and 524 face each other in the vertical direction, and a wafer is loaded on each of the pick-up hands 521, 522, 523, and 524. In this embodiment, the main transfer robot 500 is provided with the four pick-up hands 521, 522, 523, and 524, but the number of the pick-up hands 521, 522, 523, and 524 may be increased according to the process efficiency of the substrate-processing system 1000.

The pick-up hands 521 and 522 transferring primitive wafers may be referred to as load pick-up hands, and the pick-up hands 523 and 524 transferring processed wafers may be referred to as unload pick-up hands. In this case, the load pick-up hands 521 and 522 and the unload pick-up hands 523 and 524 are disposed separately, not alternately. For example, the unload pick-up hands 523 and 524 may be disposed over the load pick-up hands 521 and 522. Accordingly, the main transfer robot 500 prevents processed wafers from being contaminated by primitive wafers while transferring the primitive wafers and the processed wafers, thereby improving the yield of products.

The respective load pick-up hands 521 and 522 take out the primitive wafers from the buffer unit 300 and provide the processed wafers to the unemployed one of the process chambers 600. The load pick-up hands 521 and 522 are spaced the first gap of the respective supports of the buffer unit 300. Thus, the load pick-up hands 521 and 522 can take out simultaneously the primitive wafers from the buffer unit 300.

The respective unload pick-up hands 523 and 524 take out processed wafers from the process chamber 600 that have completed a process and then load the processed wafers to the buffer unit 300. The unload pick-up hands 523 and 524 are spaced the first gap. Thus, the unload pick-up hands 523 and 524 can simultaneously load the processed wafers taken out from the process chambers 600, to the buffer unit 300. In this embodiment, the number of the load pick-up hands 521 and 522 and the number of the unload pick-up hands 523 and 524 are two, respectively, but the numbers may be increased according to the process efficiency of the substrate-processing system 1000.

For example, the number of the supports in the buffer unit 300, spaced the first gap and disposed sequentially, and the maximum number of the index arms 221, 222, 223, and 224 in the index robot 200, taking out or loading wafers from or to the buffer unit 300 at once, and the maximum number of the pick-up hands 521, 522, 523, and 524 in the main transfer robot 500, taking out or loading wafers from or to the buffer unit 300 at once are the same.

As such, the main transfer robot 500 takes out a plurality of primitive wafers or one primitive wafer at once from the buffer unit 300. Also, the main transfer robot 500 loads a plurality of processed wafers or one processed wafer at once to the buffer unit 300. Accordingly, since a transfer time of wafers is reduced, the substrate-processing system 1000 can reduce the process time and improve the productivity.

The pick-up hands 521, 522, 523, and 524 are connected to the connection parts 530. The connection parts 530 coupled to the hand-driving part 510 horizontally move the connected pick-up hands 521, 522, 523, and 524 according to driving of the hand-driving part 510.

The rotation part 540 is disposed under the hand-driving part 510. The rotation part 540 is coupled to the hand-driving part 510 and rotates to rotate the hand-driving part 510. Accordingly, the pick-up hands 521, 522, 523, and 524 rotate together.

The vertical movement part 550 is disposed under the rotation part 540, and the horizontal movement part 560 is disposed under the vertical movement part 550. The vertical movement part 550 is coupled to the rotation part 540 and moves the rotation part 540 upward and downward, so as to adjust vertical positions of the hand-driving part 510 and the pick-up hand part 520. The horizontal movement part 560 is coupled to the second transfer rail 30 and moves along the second transfer rail 30. Accordingly, the main transfer robot 500 moves between the buffer unit 300 and the process chambers 600.

Both sides of the transfer passage 400 where the main transfer robot 500 is disposed are provided with the respective process chambers 600 processing primitive wafers and forming processed wafers. Processes performed in the process chambers 600 include a cleaning process for cleaning primitive wafers. Each two of the process chambers 600 face each other and the transfer passage 400 is disposed between the two process chambers 600. The three process chambers 600 are disposed on each of the both sides of the transfer passage 400.

Although the substrate-processing system 1000 includes the six process chambers 600 in this embodiment, the number of the process chambers 600 may be increased or decreased according to the process efficiency and the footprint conditions of the substrate-processing system 1000. Also, although the process chambers 600 are disposed in a single layer structure in this embodiment, twelve process chambers may be classified into two six-process-chamber groups in a multilayer structure.

The index robot 200 is connected to the first control unit 710, and the main transfer robot 500 is connected to the second control unit 720. The first control unit 710 controls a position of the index robot 200, and the second control unit 720 controls a position of the main transfer robot 500.

Particularly, the first control unit 710 controls the horizontal movement part 260 of the index robot 200 to adjust a position of the index robot 200 on the first transfer rail 20, that is, a horizontal movement position of the index robot 200 and a horizontal movement velocity of the index robot 200. The first control unit 710 controls the rotation part 240 of the index robot 200 to adjust a rotational position and a rotational velocity of the index arm group 220, and controls the vertical movement part 250 of the index robot 200 to adjust a vertical movement position and a vertical movement velocity of the index arm part 220.

Specifically, when adjusting the vertical movement velocity of the vertical movement part 250, the first control unit 710 using an impulse response superposition method reduces vibration and noise of a wafer generated by the vertical movement. Here, an impulse response of the impulse response superposition method is an output when applying an impulse input to an arbitrary target.

Particularly, when the index arms 221, 222, 223, and 224 (refer to FIG. 2) with loaded wafers vertically moves, the first control unit 710 adjusts the movement velocity of the index robot 200 to apply a new impulse to the wafers placed on the index arms 221, 222, 223, and 224. Accordingly, an impulse response due to a current impulse is superposed on an impulse response due to the new impulse, thereby reducing vibration applied to the wafers on the index arms 221, 222, 223, and 224.

Figure 5:
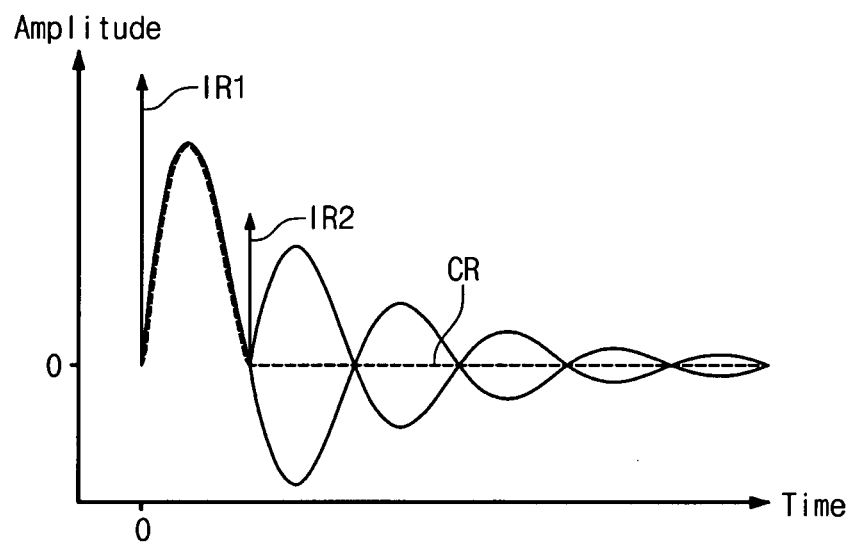
FIG. 5 is a graph illustrating residual vibration canceled through impulse response superposition according to an embodiment of the present invention.

FIG. 5 is a graph illustrating residual vibration canceled through impulse response superposition according to an embodiment of the present invention.

Referring to FIG. 5, an impulse response IR1 generated by a first impulse is superposed on an impulse response IR2 generated by a second impulse, and a combined response CR where the impulse responses IR1 and IR2 are combined is equal to zero. That is, when the impulse responses IR1 and IR2 input at different points of time from each other are combined, the impulse responses IR1 and IR2 are canceled.

Figure 6:
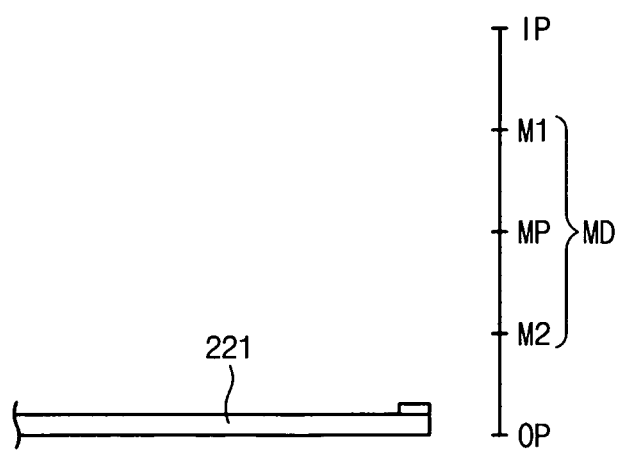
FIG. 6 is a schematic view illustrating a process that a first control unit illustrated in FIG. 1 controls a vertical movement velocity according to a vertical position of the index robot, using an impulse response method according to an embodiment of the present invention.
Figure 7:
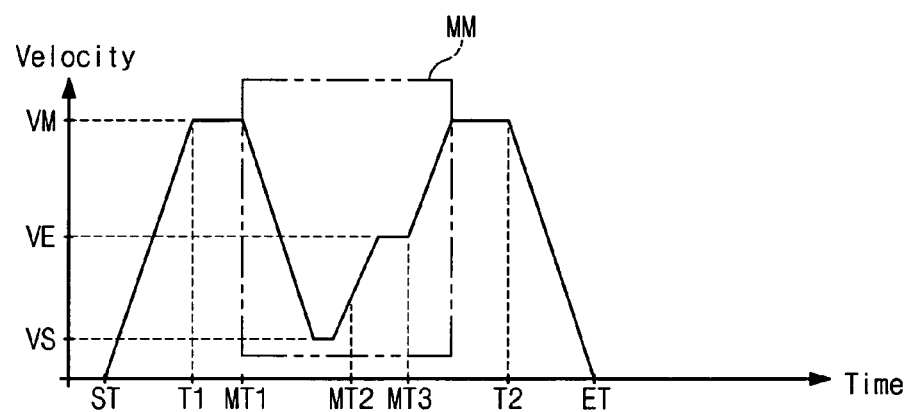
FIG. 7 is a graph illustrating the vertical movement velocity of the index robot according to respective divisions illustrated in FIG. 6.
Figure 8:
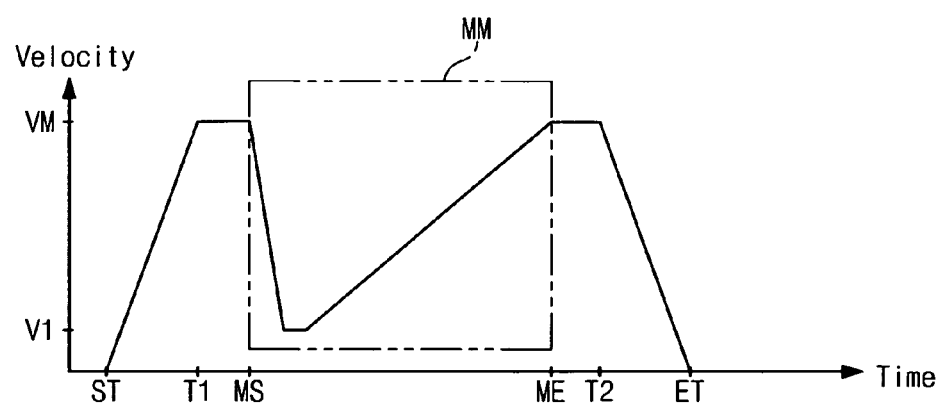
FIGS. 8 to 15 are views illustrating variations in the vertical movement velocity of the index robot controlled by the first control unit illustrated in FIG. 1.
Figure 9:
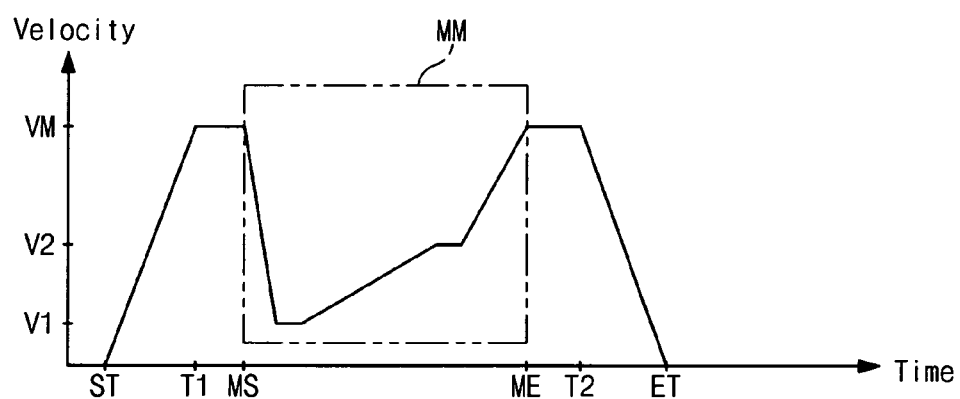
Figure 10:
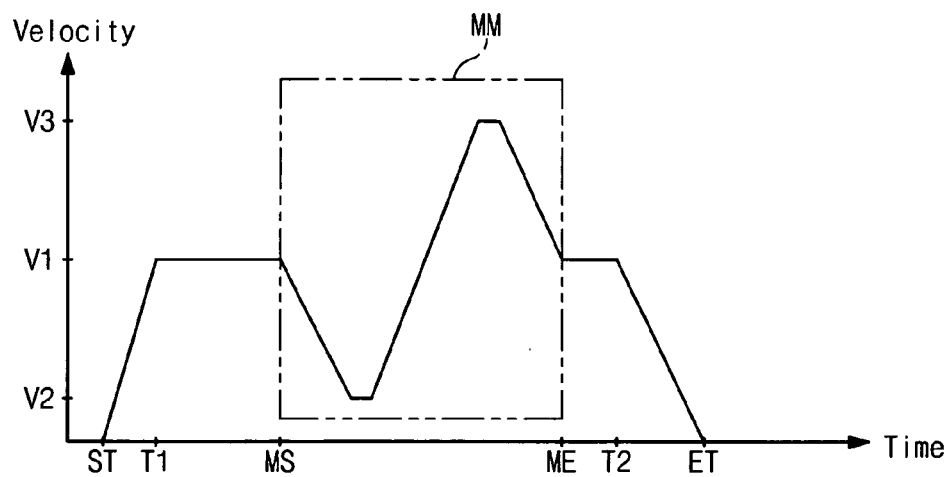
Figure 11:
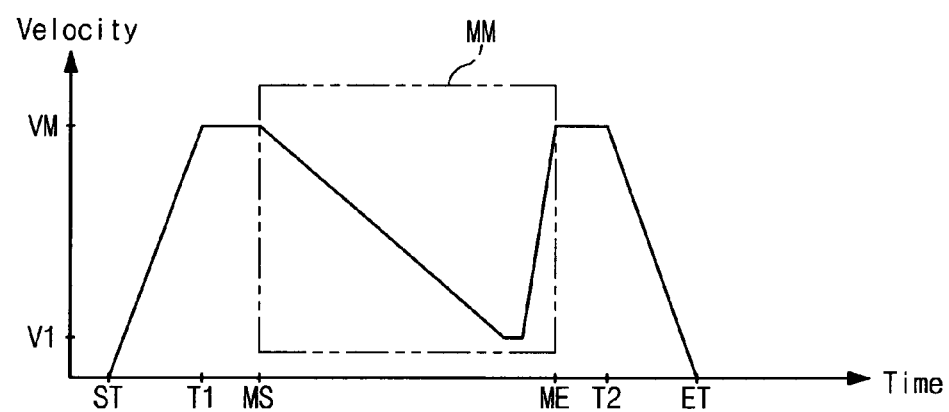
Figure 12:
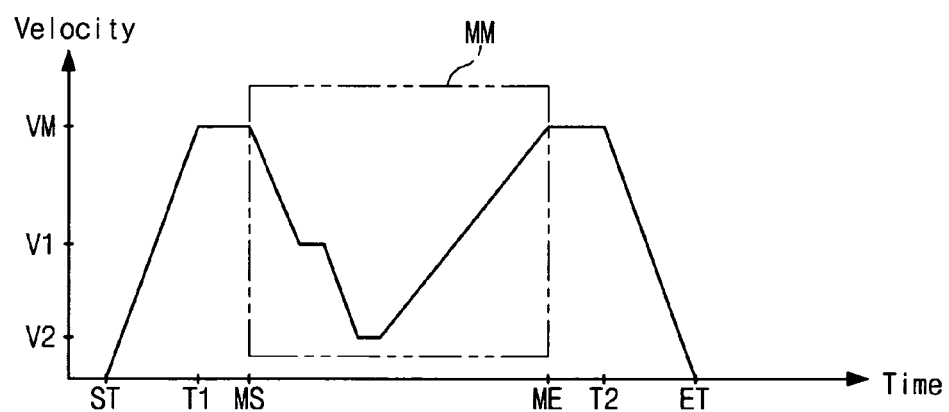
Figure 13:
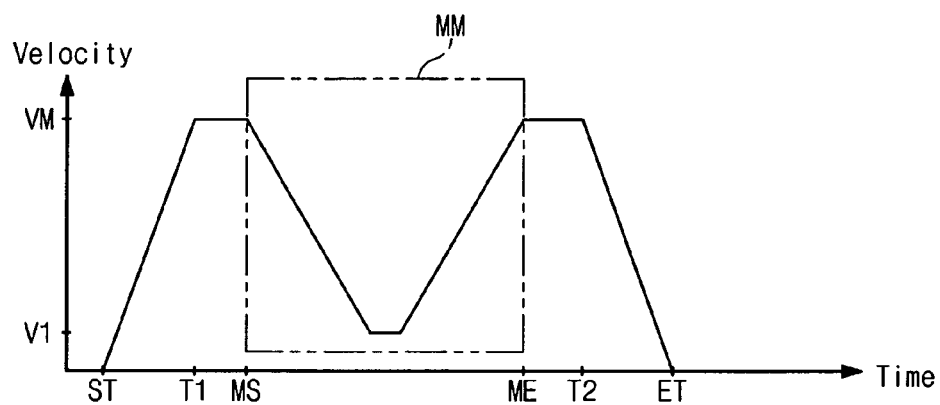
Figure 14:
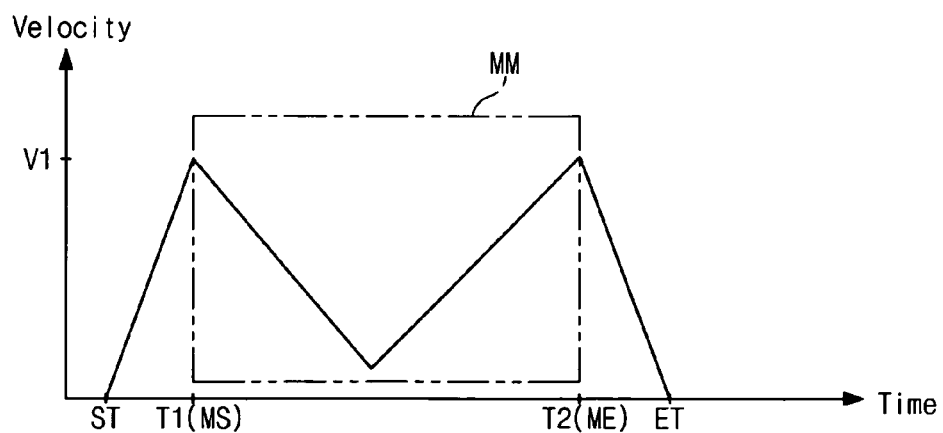
Figure 15:
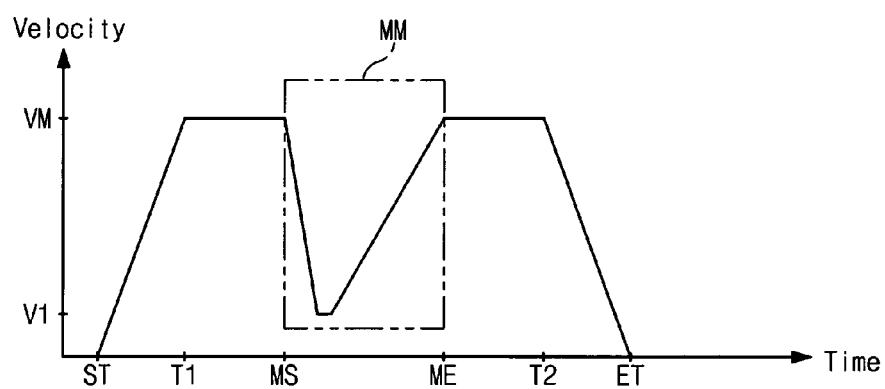

FIG. 6 is a schematic view illustrating a process that the first control unit 710 illustrated in FIG. 1 controls the vertical movement velocity according to the vertical position of the index robot 200, using an impulse response method according to an embodiment of the present invention. FIG. 7 is a graph illustrating the vertical movement velocity of the index robot 200 in respective divisions illustrated in FIG. 6

Referring to FIGS. 1, 6 and 7, the first control unit 710 controls the velocity of the load index arm 221 according to the vertical movement position of the load index arm 221 when the index robot 200 moves vertically. That is, when the index arm 221 moves from a pick-up point OP where a wafer is picked up, to a place point IP where a wafer is loaded, or when the index arm 221 moves from the place point IP to the pick-up point OP, the first control unit 710 identifies a division between the pick-up point OP and the place point IP as four divisions. Particularly, when a middle point MP is in the middle between the pick-up point OP and the place point IP, the middle part between the place point IP and the middle point MP is set to a first modification point M1, and the middle part between the pick-up point OP and the middle point MP is set to a second modification point M2. Referring to FIG. 6, the division between the first modification point M1 and the second modification point M2 is referred to as a modification division MD.

The first control unit 710 controls the vertical movement velocity of the index robot 200 on the basis of the respective point OP, IP, MP, M1, M2. That is, in the related art, when the index robot 200 is vertically accelerated to reach a preset maximum velocity, the index robot 200 is in uniform motion at the maximum velocity, and then the index robot 200 is decelerated near a target point. However, the first control unit 710 varies the velocity in the division where the index robot 200 is in uniform motion at the maximum velocity in the related art, thereby applying a new impulse to a wafer.

Hereinafter, when the index robot 200 moves from the pick-up point OP to the place point IP, the movement velocity of the index robot 200 varied by the first control unit 710 will now be described in detail.

Particularly, the vertical movement part 250 (refer to FIG. 2) of the index robot 200 moves such that the index arm 221 moves at a preset acceleration from the pick-up point OP to the second modification point M2, and when the index arm 221 reaches a preset maximum velocity VM, the index arm 221 is in uniform motion at the maximum velocity VM. The pick-up point OP is a start point ST where the index robot 200 starts to move vertically.

When the index arm 221 arrives at the second modification point M2, the first control unit 710 changes the vertical movement velocity of the index robot 200 to start a modification motion for the impulse response superposition. Here, the second modification point M2 is a start point MT1 of the modification motion. When the index robot 200 moves from the place point IP to the pick-up point OP, the second modification point M2 is an end point of the modification motion.

When the modification motion starts, the vertical movement part 250 of the index robot 200 is decelerated from the maximum velocity VM to a preset minimum velocity VS and then in uniform motion at the preset minimum velocity VS for a predetermined time.

Then, when the index arm 221 passes through the middle point MP and arrives at the first modification point M1, the vertical movement part 250 is accelerated to the maximum velocity VM again. Here, the first modification point M1 is an end point of the modification motion. When the index robot 200 moves from the place point IP to the pick-up point OP, the first modification point M1 is a start point of the modification motion.

Then, the vertical movement part 250 is in uniform motion at the maximum velocity VM until the index arm 221 is close to the place point IP. Reference character MM of FIG. 7 represent a modification motion division.

As such, the first control unit 710 periodically changes the vertical movement velocity of the index robot 200 while the index arm 221 of the index robot 200 moves between the first and second modification points M1 and M2, that is, in the modification division MD when the index robot 200 moves vertically. That is, while the index arm 221 moves in the modification division MD, the index arm 221 is in one of the acceleration motion, the deceleration motion, and the uniform motion according to the preset movement divisions, and the motion in the current division is different from that in the precedent division. For example, when the index arm 221 is accelerated in the precedent division, the index arm 221 is decelerated or in uniform motion in the current division.

As such, when the motion type of the index arm 221 is changed according to the divisions, impulse applied to a wafer on the index arm 221 is also varied according to the divisions, thereby canceling vibration of the wafer. Accordingly, the substrate-processing system 1000 can move the index robot 200 at the maximum velocity without considering the vibration of the wafer, thereby reducing time for transferring a substrate and improving the productivity.

In this embodiment, since the variations in the movement velocity of the index robot 200 due to the first control unit 710 when the index robot 200 moves from the place point IP to the pick-up point OP, are the same as those when the index robot 200 moves from the pick-up point OP to the place point IP, the detailed description thereof will be omitted.

Referring again to FIGS. 1 and 4, the second control unit 720 controls the horizontal movement part 560 of the main transfer robot 500 to adjust a position of the main transfer robot 500 on the second transfer rail 30, that is, a horizontal movement position of the main transfer robot 500 and a horizontal movement velocity of the main transfer robot 500. The second control unit 720 controls the rotation part 540 of the main transfer robot 500 to adjust rotational positions and rotational velocities of the pick-up hands 521, 522, 523, and 524, and controls the vertical movement part 550 of the main transfer robot 500 to adjust vertical movement positions and vertical movement velocities of the pick-up hands 521, 522, 523, and 524.

Specifically, when adjusting the vertical movement velocity of the vertical movement part 550 of the main transfer robot 500, the second control unit 720 using the impulse response superposition method reduces vibration and noise of a wafer generated by the vertical movement.

Also, since a process in this embodiment where the second control unit 720 adjusts the vertical movement velocity of the main transfer robot 500 to cancel vibration of wafers placed on the pick-up hands 521, 522, 523, and 524 is the same as the process where the first control unit 710 cancels vibration of a wafer placed on the index arm 221, detailed description thereof will be omitted.

FIGS. 8 to 15 are views illustrating variations in the vertical movement velocity of the index robot 200 controlled by the first control unit 710 illustrated in FIG. 1.

Referring to FIG. 6 and FIGS. 8 to 15, the first control unit 710 (refer to FIG. 1) decreases or increases the vertical movement velocity of the index robot 200 during the modification motion division MM where the modification motion is performed, so as to periodically change the vertical movement velocity of the index robot 200. That is, in the case where the index arm 221 of the index robot 200 moves from the place point IP to the pick-up point OP or from the pick-up point OP to the place point IP, when the index arm 221 arrives at the modification division MD, the first control unit 710 starts the modification motion of the index robot 200. The modification motion division MM illustrated in FIGS. 8 to 15 illustrates the movement velocity variation made while the index arm 221 moves within the modification division MD.

Referring to FIGS. 8 through 15, the index arm 221 reaches a preset reference velocity before arriving at the modification division MD, and is accelerated until reaching the reference velocity. After that, when the index arm 221 arrives at the modification division MD, the index arm 221 is in any one of an acceleration motion, a deceleration motion, and a uniform motion according to preset divisions while moving within the modification division MD, in which the motion in the current division is different from the motion in the precedent division. The reference velocity is the maximum velocity in FIG. 8 through 15 except for FIG. 10. As such, since the index arm 221 is in the different motion from that in the precedent division, an impulse different from that in the precedent division is applied to a wafer loaded on the index robot 200. Accordingly, the vibration of the wafer loaded on the index robot 200 is canceled by the impulse response superposition.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A method of adjusting a movement velocity of a transfer member having a plurality of transfer arms on which substrates are loaded, the respective transfer arms facing a ground, the method comprising:
   accelerating the transfer member from a start point where the transfer member starts to move vertically to a first point where the movement velocity reaches a preset reference velocity;
   gradually decelerating the transfer member moving at the reference velocity from a second point to a target point; and
   dividing a division from the first point to the second point into N movement divisions (where N is a natural number that is at least two) to move the transfer member in any one of a deceleration motion, an acceleration motion, and a uniform motion according to the respective movement divisions,
   wherein the motion of the transfer member in the current movement division is different from that in the movement division just before the current movement division.

2. The method of claim 1, wherein the transfer member is in the acceleration motion in at least one of the movement divisions, and in the deceleration motion in at least one of the movement divisions.

3. The method of claim 2, wherein the transfer member is in the uniform motion in the middle one of the three movement divisions sequentially disposed, and the transfer member is in the acceleration or deceleration motion in the movement division just before the middle movement division and in the movement division just after the middle movement division.

4. The method of claim 3, wherein the transfer member is in the uniform motion at the reference velocity in the first movement division and the last movement division.

5. A substrate-transferring method using a transfer member having a plurality of transfer arms to which substrates are loaded, the respective transfer arms facing a ground, the method comprising:
   moving the transfer member to a storage member to load or pick up the substrate in the storage member;
   vertically moving the transfer member to be disposed at a target point in the storage member; and
   loading the substrate, placed on an upper surface of the transfer member, on the target point, or picking up the substrate loaded on the target point, wherein the moving of the transfer member includes:
   accelerating the transfer member from a start point where the transfer member starts to move vertically to a first point where a movement velocity reaches a preset reference velocity;
   dividing a division from the first point to a second point into N movement divisions (where N is a natural number that is at least two) to move the transfer member in any one of a deceleration motion, an acceleration motion, and a uniform motion according to the respective movement divisions; and
   decelerating the transfer member moving at the reference velocity from the second point to the target point, and the motion of the transfer member in the current movement division is different from that in the movement division just before the current movement division.

6. The substrate-transferring method of claim 5, wherein the transfer member is in the acceleration motion in at least one of the movement divisions, and in the deceleration motion in at least one of the movement divisions.

7. The substrate-transferring method of claim 6, wherein the transfer member is in the uniform motion in the middle one of the three movement divisions sequentially disposed, and the transfer member is in the acceleration or deceleration motion in the movement division just before the middle movement division and in the movement division just after the middle movement division.

8. The substrate-transferring method of claim 7, wherein the transfer member is in the uniform motion at the reference velocity in the first movement division and the last movement division.

9. The substrate-transferring method of claim 8, wherein when a division between the start point and the target point is divided into four divisions, the first point is a boundary between the first one and the second one of the four divisions, and the second point is a boundary between the third one and the fourth one of the four divisions.

10. A substrate-processing apparatus comprising:
a storage member arranging a plurality of substrates in a vertical direction to store the substrates;
a transfer member including a plurality of transfer arms facing each other in the vertical direction, an arm-driving part moving the respective transfer arm horizontally, and a vertical movement part disposed under the arm-driving part to change a vertical position of the respective transfer arm, the substrates being loaded on the respective transfer arm, the transfer member taking out and loading at least one substrate from and to the storage member; and
a control unit adjusting a movement velocity of the vertical movement part until the transfer member moves vertically to reach a target point in the storage member, wherein the control unit accelerates the vertical movement part to a preset reference velocity until the transfer member arrives at a first point from a start point, and the control unit gradually decelerates the vertical movement part moving at the reference velocity until the transfer member arrives at the target point from a second point, and while the transfer member moves within a division between the first point and the second point, the division being divided into N movement divisions (where N is a natural number that is at least two), the control unit vertically moves the vertical movement part in any one of a deceleration motion, an acceleration motion, and a uniform motion according to the respective movement divisions, and the control unit controls the vertical movement part such that the motion of the vertical movement part in the current movement division is different from that in the movement division just before the current movement division.

11. The substrate-processing apparatus of claim 10, wherein when adjusting the movement velocity of the vertical movement part, the control unit controls the vertical movement part to be in the acceleration motion in at least one of the movement divisions, and in the deceleration motion in at least one of the movement divisions.

12. A substrate-processing apparatus comprising:
a storage container spacing substrates to be processed or processed substrates in a vertical direction to store the substrates;
a buffer unit spacing the substrates to be processed and the processed substrates in the vertical direction to store the substrates;
an index robot including a plurality of index arms facing each other in the vertical direction, an arm-driving part moving the respective index arm horizontally, and a first vertical movement part disposed under the arm-driving part to change a vertical position of the respective index arm, the substrates being loaded on the respective index arm, the index robot transferring the substrate between the storage container and the buffer unit, the index robot taking out and loading at least one substrate from and to the storage container or the buffer unit; and
a first control unit adjusting a movement velocity of the first vertical movement part until the index robot moves vertically to reach a target point in the storage container or the buffer unit;
wherein the first control unit accelerates the first vertical movement part to a preset first reference velocity until the index robot arrives at a first point from a start point, and the first control unit gradually decelerates the first vertical movement part moving at the first reference velocity until the index robot arrives at the target point from a second point, and while the index robot moves within a division between the first point and the second point, the division being divided into N arm movement divisions (where N is a natural number that is at least two), the first control unit vertically moves the first vertical movement part in any one of a deceleration motion, an acceleration motion, and a uniform motion according to the respective arm movement divisions, and the first control unit controls the first vertical movement part such that the motion of the first vertical movement part in the current arm movement division is different from that in the arm movement division just before the current arm movement division.

13. The substrate-processing apparatus of claim 12, further comprising:
a process chamber where the substrate is processed;
a storage member arranging the substrates in the vertical direction to store the substrates;
a transfer member including a plurality of pick-up hands facing each other in the vertical direction, a hand-driving part moving the respective pick-up hand horizontally, and a second vertical movement part disposed under the hand-driving part to change a vertical position of the pick-up hand, the substrates being loaded on the respective pick-up hand, the transfer member taking out and loading at least one substrate from and to the storage member; and
a second control unit adjusting a movement velocity of the second vertical movement part until the transfer member moves vertically to reach a target point in the buffer unit, wherein the second control unit accelerates the second vertical movement part to a preset second reference velocity until the transfer member arrives at a third point from a start point, and the second control unit gradually decelerates the second vertical movement part moving at the second reference velocity until the transfer member arrives at the target point from a fourth point, and while the transfer member moves within a division between the third point and the fourth point, the division being divided into M hand movement divisions (where M is a natural number that is at least two), the second control unit vertically moves the second vertical movement part in any one of a deceleration motion, an acceleration motion, and a uniform motion according to the respective hand movement divisions, and the second control unit controls the second vertical movement part such that the motion of the second vertical movement part in the current hand movement division is different from that in the movement division just before the current hand movement division.

* * * * *